United States Patent
Laidig et al.

(10) Patent No.: US 10,983,441 B2
(45) Date of Patent: Apr. 20, 2021

(54) RESOLUTION ENHANCED DIGITAL LITHOGRAPHY WITH ANTI-BLAZED DMD

(71) Applicant: Applied Materials, Inc., Santa Clara, CA (US)

(72) Inventors: Thomas L. Laidig, Richmond, CA (US); Hwan J. Jeong, Los Altos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/532,187

(22) Filed: Aug. 5, 2019

(65) Prior Publication Data

US 2019/0361353 A1 Nov. 28, 2019

Related U.S. Application Data

(63) Continuation of application No. 15/871,302, filed on Jan. 15, 2018, now Pat. No. 10,372,042.

(Continued)

(51) Int. Cl.
*G03F 7/20* (2006.01)
*G02B 26/08* (2006.01)

(52) U.S. Cl.
CPC .......... *G03F 7/702* (2013.01); *G03F 7/70291* (2013.01); *G02B 26/0833* (2013.01)

(58) Field of Classification Search
CPC ............. G03F 7/70191; G03F 7/70058; G03F 7/70291; G02B 26/084

(Continued)

(56) References Cited

U.S. PATENT DOCUMENTS 6,963,434 B1   11/2005   Latypov
7,170,669 B1   1/2007    Jain et al.
(Continued)

FOREIGN PATENT DOCUMENTS

JP   2005123586 A   5/2005
JP   2005322924 A   11/2005
(Continued)

OTHER PUBLICATIONS

International Search Report and Written Opinion dated Apr. 16, 2018 for Application No. PCT/US2017/067805.

(Continued)

*Primary Examiner* — Hung Nguyen
(74) *Attorney, Agent, or Firm* — Patterson + Sheridan LLP

(57) ABSTRACT

Embodiments of the present disclosure generally relate to methods and apparatus for processing one or more substrates, and more specifically to improved spatial light modulators for digital lithography systems and digital lithography methods using improved spatial light modulators. The spatial light modulator is configured such that there is a 180-degree phase shift between adjacent spatial light modulator pixels. The spatial light modulator is useful for pixel blending by forming a plurality of partially overlapping images, at least one of the plurality of partially overlapping images having at least two pixels formed by a first pair of adjacent spatial light modulator pixels having a 180-degree phase shift therebetween. The spatial light modulator results in improved resolution, depth of focus, and pixel blending.

13 Claims, 5 Drawing Sheets

Related U.S. Application Data

(60) Provisional application No. 62/448,743, filed on Jan. 20, 2017.

(58) Field of Classification Search
USPC .................................. 355/67; 359/291–292
See application file for complete search history.

(56) References Cited

U.S. PATENT DOCUMENTS

| | | | |
|---|---|---|---|
| 7,187,484 | B2 | 3/2007 | Mehrl |
| 7,372,547 | B2 | 5/2008 | Eib et al. |
| 7,385,750 | B2 * | 6/2008 | Govil et al. ............ G03B 27/54 355/67 |
| 8,186,833 | B2 | 5/2012 | Govil et al. |
| 9,291,814 | B2 * | 3/2016 | Owa ..................... G02B 27/425 |
| 2003/0214644 | A1 * | 11/2003 | Shirota ............... G03F 7/70291 355/67 |
| 2005/0068599 | A1 * | 3/2005 | Mushika ............. G03F 7/70291 359/237 |
| 2005/0243398 | A1 | 11/2005 | Latypov |
| 2009/0303571 | A1 | 12/2009 | Sandstrom |
| 2010/0255426 | A1 | 10/2010 | Jain et al. |
| 2016/0077351 | A1 | 3/2016 | Iwane |
| 2016/0223914 | A1 | 8/2016 | Owa et al. |
| 2017/0003598 | A1 | 1/2017 | Johnson et al. |

FOREIGN PATENT DOCUMENTS

| | | |
|---|---|---|
| JP | 2005354059 A | 12/2005 |
| KR | 10-2012-0038801 | 4/2012 |
| WO | 2009130603 A2 | 10/2009 |
| WO | 2012036252 A1 | 3/2012 |
| WO | 2012039353 A1 | 3/2012 |

OTHER PUBLICATIONS

Taiwan Office Action dated Mar. 28, 2019 for Application No. 107100378.

Japanese Office Action dated Jul. 14, 2020 for Application No. 2019-539287.

Japanese Office Action dated Dec. 8, 2020 for Application No. 2019-539287.

Taiwan Office Action dated Nov. 18, 2020, for Taiwan Patent Application No. 109101507.

* cited by examiner

RESOLUTION ENHANCED DIGITAL LITHOGRAPHY WITH ANTI-BLAZED DMD

CROSS-REFERENCE TO RELATED APPLICATIONS

This application is a continuation of U.S. patent application Ser. No. 15/871,302, filed on Jan. 15, 2018, issued as U.S. Pat. No. 10,372,042 on Aug. 6, 2019, and which claims benefit of U.S. Provisional Patent Application Ser. No. 62/448,743, filed on Jan. 20, 2017, which are herein incorporated by reference in their entirety.

BACKGROUND

Field

Embodiments of the present disclosure generally relate to methods and apparatus for processing one or more substrates, and more specifically to improved spatial light modulators for digital lithography systems and methods of fabrication thereof.

Description of the Related Art

Spatial light modulators are often used to impose a spatial varying modulation on a beam of light. Digital micromirror devices (DMDs), which are an example of spatial light modulators, are used as reflective digital light switches in a variety of applications, including digital lithography. For digital lithography, the DMD is generally combined with other image processing components, such as memory, a light source and optics, and used to project bright, colorful images onto a projection screen.

A DMD generally includes several hundred thousand microscopic mirrors ("micromirrors") arranged in a rectangular array. Each micromirror corresponds to a single pixel of the image to be displayed and can be tilted at various angles about a hinge. Depending on the tilt angle of the micromirror, the micromirror is in an "on" or "off" state. In the on state, light is reflected from the DMD into a lens and ultimately a pixel is brightly projected onto a screen. In the off state, light is directed elsewhere, such as a light dump, and the projected pixel appears dark.

The phase shift between adjacent micromirrors of the DMD affects the resolution of the projected image and the depth of focus. Generally, the phase shift between adjacent micromirrors of the DMD is 0 degrees. A DMD having the 0 degree phase shift between adjacent micromirrors is known as a blazed DMD. While blazed DMDs exhibit good resolution and depth of focus, as device dimensions become smaller, improved resolution and better depth of focus are needed, especially for line spacing. In digital lithography, hard phase shift masks have been used to print very narrow and dark lines. However, hard phase shift masks are limited by the topology of the substrate.

Thus, there is a need in the art for an improved spatial light modulator, which increases image resolution and depth of focus, and digital lithography methods for use thereof.

SUMMARY

Embodiments of the present disclosure generally relate to methods and apparatus for processing one or more substrates, and more specifically to improved spatial light modulators for digital lithography systems and digital lithography methods using improved spatial light modulators. The spatial light modulator is configured such that there is a 180-degree phase shift between adjacent spatial light modulator pixels. The spatial light modulator is useful for pixel blending by forming a plurality of partially overlapping images, at least one of the plurality of partially overlapping images having at least two pixels formed by a first pair of adjacent spatial light modulator pixels having a 180-degree phase shift therebetween. The spatial light modulator results in improved resolution, depth of focus, and pixel blending.

In one embodiment, a digital lithography method is disclosed. The digital lithography method includes forming a first image having at least two pixels on a substrate. The at least two pixels correspond to a first pair of adjacent spatial light modulator pixels of a plurality of spatial light modulator pixels of a spatial light modulator. The first pair of adjacent spatial light modulator pixels has a 180-degree phase shift therebetween.

In another embodiment, a digital lithography method is disclosed. The digital lithography method includes positioning at least one micromirror of a plurality of micromirrors to a third position between a first position and a second position and reflecting light from the third position. Light reflected from the first position is projected onto a substrate. Light reflected from the first position has a first brightness. Light reflected from the second position is directed to a light dump. Light reflected from the third position has a second brightness less than the first brightness.

In yet another embodiment, a spatial light modulator is disclosed. The spatial light modulator includes an array of spatial light modulator pixels having at least a first spatial light modulator pixel and a second spatial light modulator pixel adjacent to one another, a phase shift between the adjacent first spatial light modulator pixel and the second spatial light modulator pixel being 180 degrees.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure generally relate to methods and apparatus for processing one or more substrates, and more specifically to improved spatial light modulators for digital lithography systems and digital lithography methods using improved spatial light modulators. The spatial light modulator is configured such that there is a 180-degree phase shift between adjacent spatial light modulator pixels. The spatial light modulator is useful for pixel blending by forming a plurality of partially overlapping images, at least one of the plurality of partially overlapping images having at least two pixels formed by a first pair of adjacent spatial light modulator pixels having a 180-degree phase shift therebetween. The spatial light modulator results in improved resolution, depth of focus, and pixel blending.

Embodiments described herein refer to digital micromirror devices (DMDs) as an example of a spatial light modulator; however, other spatial light modulators are also contemplated in the present disclosure. Other spatial light modulators include, but are not limited to, arrays of liquid crystals, such as liquid crystal displays (LCDs) and ferroelectric liquid crystal displays (FLCoS), and arrays of microscopic light emitting devices (microLEDs). Each spatial light modulator includes an array of spatial light modulator pixels that are switchable between "on" and "off" such that the pattern of spatial light modulator pixels will modulate the optical beam to provide the selected level of attenuation. In operation, the spatial light modulator pixels are controllable such that each pixel is bright, dark and/or attenuated.

In an embodiment where the spatial light modulator is a DMD, the DMD is configured in an anti-blazed condition, such that there is a 180-degree phase shift between adjacent micromirrors. The anti-blazed DMD is useful for pixel blending by forming a plurality of partially overlapping images, at least one of the plurality of partially overlapping images having at least two pixels formed by a first pair of adjacent micromirrors having a 180-degree phase shift therebetween. The anti-blazed DMD results in improved resolution, depth of focus, and pixel blending. Additionally, one or more of the micromirrors of the DMD is tilted at a position different than an on or off position such that light having less brightness is reflected onto a substrate.

Figure 1:
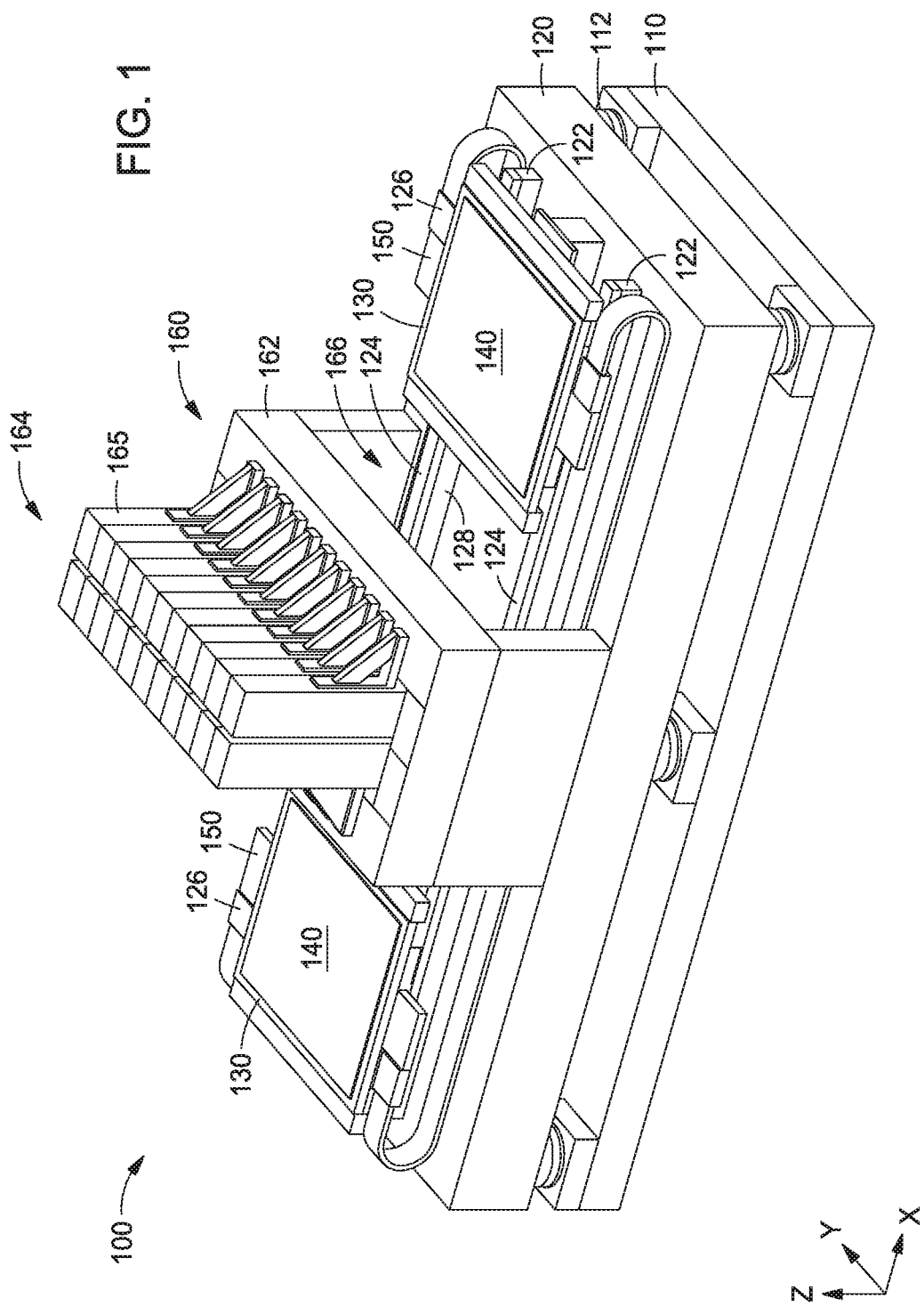
FIG. 1 is a perspective view of a system that may benefit from embodiments disclosed herein.

FIG. 1 is a perspective view of a system 100 that may benefit from embodiments disclosed herein. The system 100 includes a base frame 110, a slab 120, one or more stages 130 (two are shown as an example), and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the one or more stages 130 are be disposed on the slab 120. A substrate 140 is supported by each of the one or more stages 130. A plurality of holes (not shown) are formed in the stage 130 for allowing a plurality of lift pins (not shown) to extend therethrough. The lift pins rise to an extended position to receive the substrate 140, such as from one or more transfer robots (not shown). The one or more transfer robots are used to load and unload a substrate 140 from the one or more stages 130.

The substrate 140 is, for example, made of quartz and used as part of a flat panel display. In other embodiments, the substrate 140 is made of other materials. In some embodiments, the substrate 140 has a photoresist layer formed thereon. A photoresist is sensitive to radiation and is a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or negative photoresist. For example, the photoresist includes at least one of diazonaphthoquinone, a phenol formaldehyde resin, poly(methyl methacrylate), poly(methyl glutarimide), and SU-8. In this manner, the pattern is created on a surface of the substrate 140 to form the electronic circuitry.

The system 100 further includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the one or more stages 130 are movable along the tracks 124 in the X-direction. In one embodiment, the pair of tracks 124 is a pair of parallel magnetic channels. As shown, each track 124 of the pair of tracks 124 is linear. In other embodiments, the track 124 has a non-linear shape. An encoder 126 is coupled to each of the one or more stages 130 in order to provide location information to a controller (not shown).

The processing apparatus 160 includes a support 162 and a processing unit 164. The support 162 is disposed on the slab 120 and includes an opening 166 for the one or more stages 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIG. 2). In one embodiment, the processing unit 164 contains 84 image projection apparatus. Each image projection apparatus is disposed in a case 165. The processing apparatus 160 is useful to perform maskless direct patterning.

During operation, one of the one or more stages 130 moves in the X-direction from a loading position, as shown in FIG. 1, to a processing position. The processing position refers to one or more positions of the stage 130 as the stage 130 passes under the processing unit 164. During operation, the one or more stages 130 are lifted by a plurality of air bearings (not shown) and are movable along the pair of tracks 124 from the loading position to the processing position. A plurality of vertical guide air bearings (not shown) are coupled to each of the one or more stages 130 and positioned adjacent an inner wall 128 of each support 122 in order to stabilize the movement of the stage 130. Each of the one or more stages 130 are also movable in the Y-direction by moving along a track 150 for processing and/or indexing the substrate 140. Each of the one or more stages 130 is capable of independent operation and can scan a substrate 140 in one direction and step in the other direction. In some embodiments, when one of the one or more stages 130 is scanning a substrate 140, another of the one or more stages 130 is unloading an exposed substrate and loading the next substrate to be exposed.

A metrology system measures the X and Y lateral position coordinates of each of the one or more stages 130 in real time so that each of the plurality of image projection apparatus can accurately locate the patterns being written in a photoresist covered substrate. The metrology system also provides a real-time measurement of the angular position of each of the one or more stages 130 about the vertical or Z-axis. The angular position measurement can be used to hold the angular position constant during scanning by means of a servo mechanism or it can be used to apply corrections to the positions of the patterns being written on the substrate 140 by the image projection apparatus 290, shown in FIG. 2. These techniques may be used in any combination.

Figure 2:
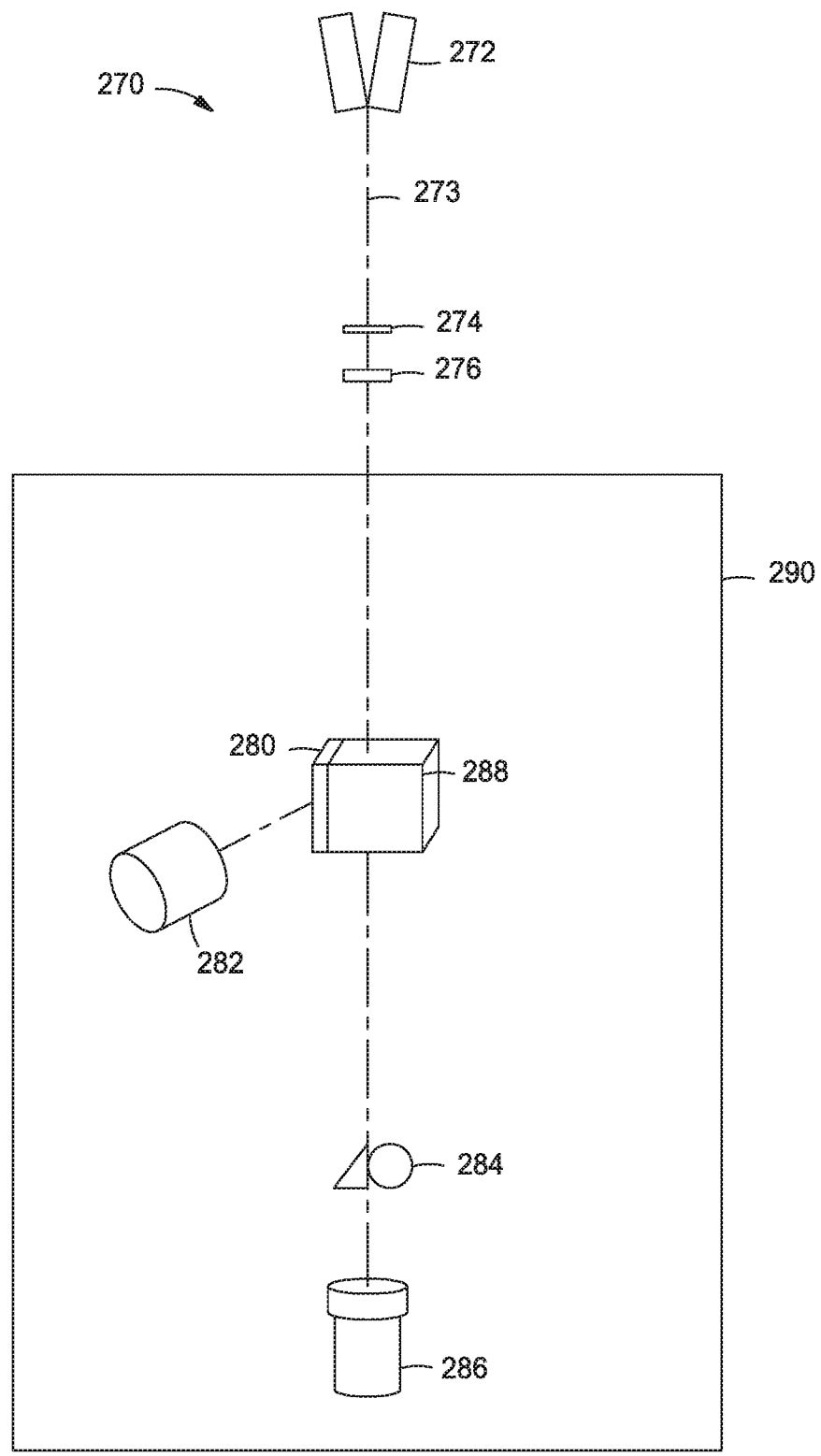
FIG. 2 is a perspective schematic view of an image projection system of FIG. 1 according to embodiments disclosed herein.

FIG. 2 is a perspective schematic view of an image projection system 270 of the system 100 according to embodiments disclosed herein. An image projection system includes a spatial light modulator, a focus sensor and/or camera, and a projection lens. In the embodiment shown in FIG. 2, the image projection system 270 includes a light source 272, an aperture 274, a lens 276, a frustrated prism assembly 288, one or more digital micromirror devices (DMDs) 280 (one is shown), a light dump 282, a focus sensor and camera 284, and a projection lens 286. The frustrated prism assembly 288, the DMD 280, the focus sensor and camera 284, and the projection lens 286 are part of an image projection apparatus 290. In one embodiment, the light source 272 is a light emitting diode (LED) or a laser, and the light source 272 is capable of producing a light having predetermined wavelength. In one embodiment, the predetermined wavelength is in the blue or near ultraviolet (UV) range, such as less than about 450 nm. The frustrated prism assembly 288 includes a plurality of reflective surfaces. In one embodiment, the projection lens 286 is a 10× objective lens. Other embodiments of an image projection system, which includes a spatial light modulator other than one or more DMDs, may include fewer or more components, as necessary in the system for that particular spatial light modulator.

Figure 3:
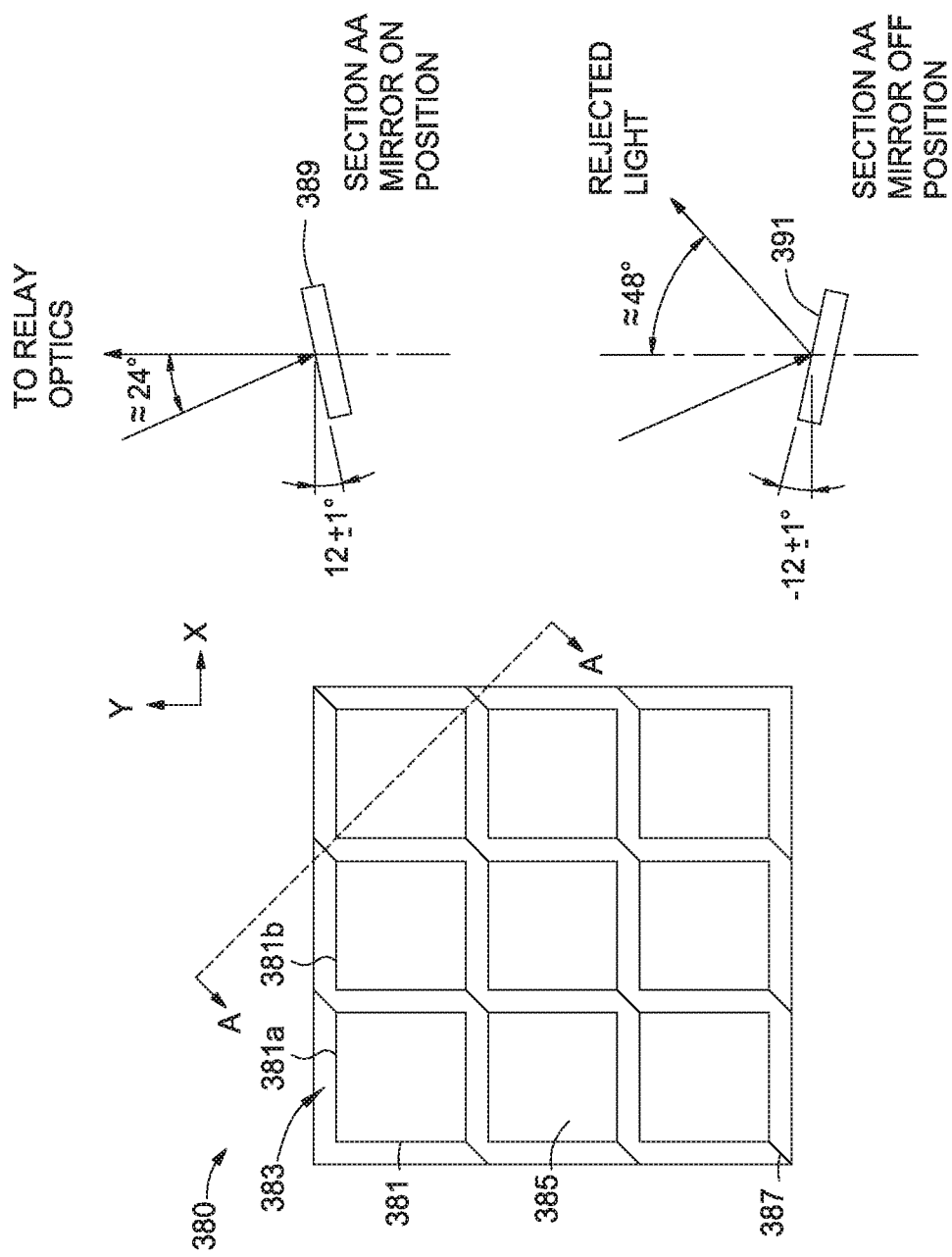
FIG. 3 is a schematic view of a micromirror array of a digital micromirror device according to embodiments disclosed herein.

During operation of the image projection system 270 shown in FIG. 2, a light beam 273 having a predetermined wavelength, such as a wavelength in the blue range, is produced by the light source 272. The light beam 273 is reflected to the DMD 280 by the frustrated prism assembly 288. As shown in FIG. 3, a DMD includes a plurality of micromirrors, and the number of micromirrors corresponds to the number of pixels to be projected. The plurality of micromirrors are individually controllable, and each micromirror of the plurality of micromirrors is at an on position or off position, based on the mask data provided to the DMD 280 by the controller (not shown). When the light beam 273 reaches the micromirrors of the DMD 280, the micromirrors that are at on position reflect the light beam 273, i.e., forming the plurality of write beams, to the projection lens 286. The projection lens 286 then projects the write beams to the surface of the substrate 140. The micromirrors that are at off position reflect the light beam 273 to the light dump 282 instead of the surface of the substrate 140.

FIG. 3 is a DMD 380 according to embodiments disclosed herein. The DMD 380 is used in the image projection apparatus 290 and the system 100. The DMD 380 is also useful in any other system or device utilizing a DMD. The DMD 380 includes a plurality of spatial light modulator pixels, which are shown as micromirrors 381, arranged in a micromirror array 383. The DMD 380 is used as a spatial light modulator and the micromirrors 381 are tilted at various degrees relative to the surfaces of the micromirrors 381 and used to adjust the incidence angle of the illumination beam on the DMD 380 so that after reflection the on beam is aimed down the center of the image projection apparatus 290 and the image created in the illumination system is centered in the projection system. In one example, the stable position for each micromirror 381 is plus or minus about 12±1 degrees with respect to the surface of the micromirror 381. Thus, in one embodiment, a first tilt position 389 corresponds to plus 12±1 degrees and a second tilt position 391 corresponds to minus 12±1 degrees.

The edges 385 of micromirrors 381 are arranged along orthogonal axes, for example the X axis and the Y axis. These axes are congruent with similar axis referenced to the substrate 140 or a stage coordinate system after taking into account a 90 degree fold introduced by the frustrated prism assembly 288. However, hinges 387 on each micromirror 381 are located on opposing corners of each micromirror causing it to pivot on axis at 45 degrees to the X axis and Y axis. As discussed above, these micromirrors 381 can be switched between on and off positions by varying the angle of tilt of the micromirrors.

In one embodiment, the hinges 387 are diagonally oriented to tilt each of the micromirrors 381 on an axis at 45 degrees to an X axis and a Y axis of each of the micromirrors 381. In another embodiment, the hinges 387 are oriented parallel to an edge 385 of each of the micromirrors 381 to tilt each of the micromirrors 381 on an axis parallel to the edge 385 of each of the micromirrors 381. In one example, all of the hinges 387 are diagonally oriented. In another example, all of the hinges 387 are oriented parallel to an edge 385 of each of the micromirrors 381. In yet another example, a first portion of the hinges 387 are diagonally oriented and a second portion of the hinges 387 are oriented parallel to an edge 385 of each of the micromirrors 381.

In conventional, blazed DMDs, the phase shift between adjacent micromirrors is 0 degrees. The conventional 0 degrees phase shift results in very little cancellation. However, the phase shift between adjacent micromirrors 381 of the DMD 380, for example first micromirror 381a and second micromirror 381b, is equal to or about 180 degrees. This configuration is referred to as an anti-blazed DMD. When the phase shift between adjacent spatial light modulator pixels, for example first micromirror 381a and second micromirror 381b, is 180 degrees, there is exact or nearly exact cancellation between the adjacent micromirrors 381 and there is symmetric brightening between adjacent pixels. In one example, each pair of adjacent micromirrors 381 has a 180-degree phase shift.

In one embodiment, in order to achieve a 180-degree phase shift between adjacent micromirrors 381, the micromirrors 381 are tilted at various angles, or remain flat, depending on the wavelength of the system in which the DMD 380 is being used. The tilt angle of the micromirrors 381 is selected to achieve the 180-degree phase shift. In one example, at a particular wavelength, a tilt angle of the first micromirror 381a and/or second micromirror 381b are about 12.25 degrees in order to achieve a 180-degree phase shift between adjacent micromirrors 381. For example, as described herein and shown in FIG. 3, micromirror 389 is tilted at an angle of 12±1 degrees, and micromirror 391 is tilted at an angle of −12±1 degrees.

The particular tilt angle of any micromirror 381 is achieved in various ways. One example of a method for achieving a particular tilt angle and 180-degree phase shift includes, but is not limited to, electrostatically controlling the tilt angle by varying the voltage applied to a microelectromechanical (MEMs) device or regions of MEMs devices over which the micromirrors 381 are positioned.

Other methods of achieving the 180-degree phase shift between adjacent micromirrors 381 or other spatial light modulator pixels include, but are not limited to, adjusting the height of at least a portion of the micromirrors 381 or spatial light modulator pixels, for example using pistons, adjusting the position of an illuminator in an image processing apparatus, such as the image projection apparatus 290, utilizing a particular wavelength for the digital lithography process, or utilizing a gas with a predetermined index of refraction, for example heavy air, in the DMD 380 or other spatial light modulators. Even further, in an embodiment using one or more DMDs for the spatial light modulator, one or more of the micromirrors is manufactured with a bump or other feature on the surface to achieve the 180-degree phase shift. In operation, some of the light will hit the bump on the micromirror surface and provide attenuation.

In the embodiments of other spatial light modulators, such as LCDs, various methods are used to achieve the 180-degree phase shift. For example, in an embodiment using an LCD, the angle at which the light beam interacts with the liquid crystals is adjusted to achieve the 180-degree phase shift. One benefit of using an LCD spatial light modulator is improved grayscale control for attenuation.

In further embodiments, acousto-optical methods and devices are used to manipulate the phase shift and attenuation between pixels. In acousto-optical devices, ultrasound can be introduced to the crystals to develop a standing wave of pressure and affect the index of refraction locally such that the direction of the light beam can be steered or attenuation can be achieved.

The exact cancellation of the adjacent spatial light modulator pixels having a 180-degree phase shift therebetween, such as in the anti-blazed DMD 380, is useful in digital lithography methods. More specifically, the cancellation is useful for pixel blending by performing several, sequential exposures to yield smoother printed features. In one embodiment, a digital lithography method using the disclosed spatial light modulators includes forming a first image having at least two pixels on a substrate, wherein the at least two pixels correspond to a first pair of adjacent spatial light modulator pixels of a plurality of spatial light modulator pixels of the spatial light modulator, the first pair of adjacent spatial light modulator pixels having a 180-degree phase shift therebetween.

Figure 4:
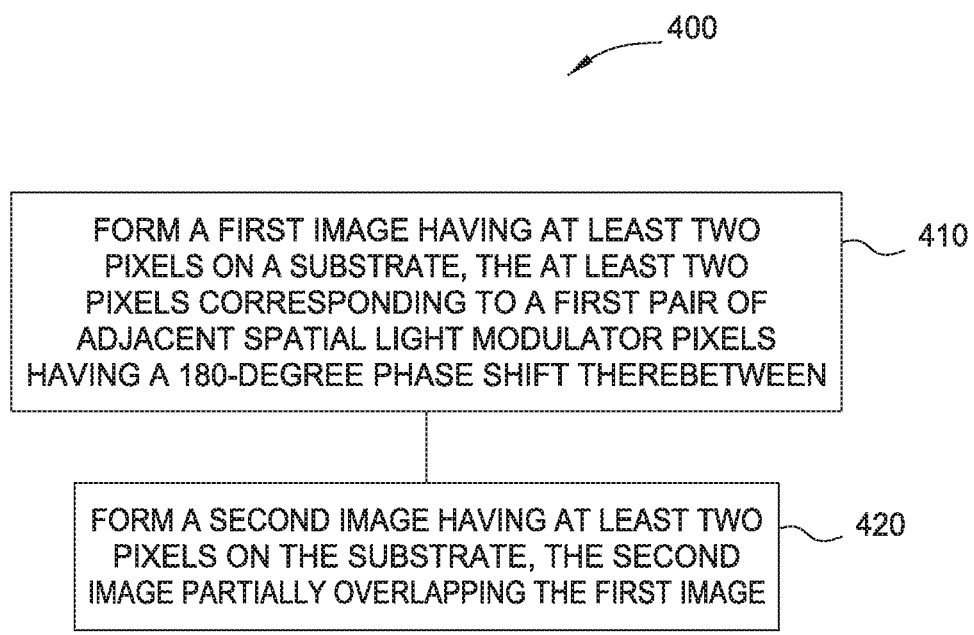
FIG. 4 is a flow chart of a digital lithography method for pixel blending according to embodiments disclosed herein.

FIG. 4 is a flow chart of a digital lithography method 400 for pixel blending according to embodiments disclosed herein. The method 400 begins at operation 410 with forming a first image having at least two pixels on a substrate. The at least two pixels correspond to a first pair of adjacent spatial light modulator pixels of a plurality of spatial light modulator pixels having a 180-degree phase shift therebetween. At operation 420, a second image having at least two pixels is formed on the substrate. The second image partially overlaps the first image. In one example, the at least two pixels of the second image correspond to a second pair of adjacent micromirrors having a 180-degree phase shift therebetween. In another example, the at least two pixels of the second image correspond to a second pair of non-adjacent micromirrors in an example where the substrate 140 is continuously moving through the system 100. In one example, the partial overlapping of the second image over the first image occurs by moving the one or more stages 130 in an X and/or Y-direction, as described above in FIG. 1. As the one or more stages 130 move in the X and/or Y-direction overlapping images are projected onto the substrate 140 by one or more of the imaging projection apparatus.

Operations 410 and 420 are repeated such that the substrate undergoes multiple exposures of multiple, overlapping images. In one example, the overlapping between the first image and the second image, as well as subsequent exposure images, may be about plus or minus one quarter of a pixel or an edge thereof. The first image and the second image may be identical. The subsequent exposure images may also be identical. The at least partial overlapping of the multiple, identical images, known as pixel blending, results in smoother printed features on the substrate. More specifically, by using the exact cancellation resulting from the 180-degree phase shift between adjacent micromirrors on an anti-blazed DMD, tighter feature spacing with darker lines between features is achieved.

Figure 5:
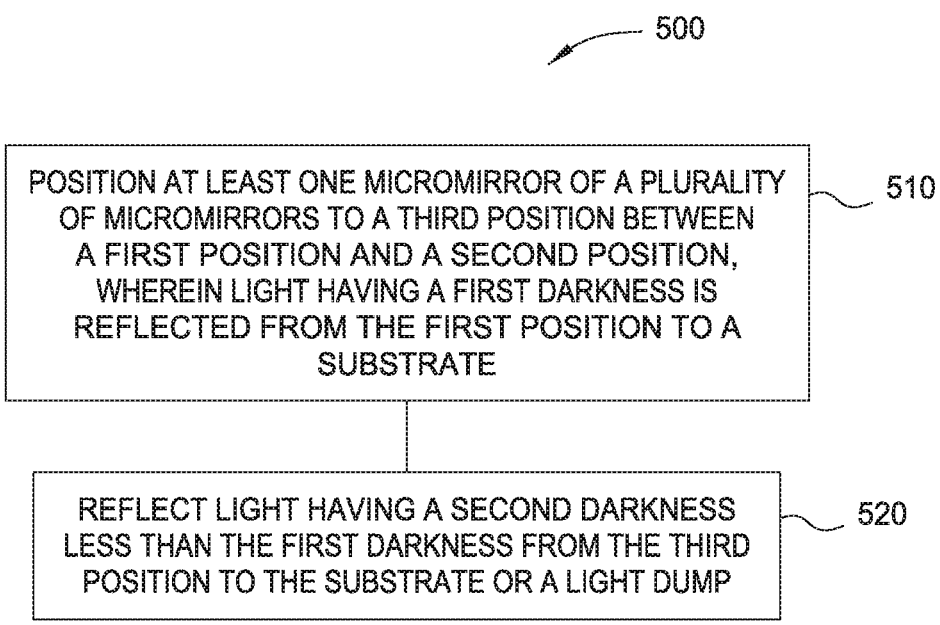
FIG. 5 is a flow chart of a digital lithography method according to embodiments disclosed herein.

FIG. 5 is a flow chart of a digital lithography method 500 according to another embodiment. The method 500 begins at operation 510 by positioning one micromirror of a plurality of micromirrors to a third position between a first position and a second position. Positioning the micromirror includes tilting the micromirror or adjusting the height of the micromirror from a surface, such as an image projection surface or a surface of the DMD.

In the embodiment shown in FIG. 3, the micromirrors 381 are tiltable and the first position 389 is about plus 12±1 degrees from a surface of micromirror 381 and corresponds to the on position. Light reflected from the first position has a first brightness and is projected onto a substrate. The second position 391 is about minus 12±1 degrees from a surface of micromirror 381 and corresponds to the off position. Light reflected from the second position is directed to a light dump, and may not be projected onto a substrate. At operation 520, light is reflected from the third position. The third position is considered to also be an off position. However, the light reflected from the third position may be reflected onto the substrate, or may not be reflected onto the substrate and may instead be reflected to the light dump. The light reflected from the third position has a second brightness less than the first brightness. In one example, the second brightness is between about five percent and about ten percent of the first brightness, such as about six percent of the first brightness.

Benefits of the above-described disclosure include, but are not limited to, increased resolution, for example about twice the resolution, and improved depth of focus in digital lithography methods, such as pixel blending. More specifically, use of the disclosed improved spatial light modulators results in projection of only coherent optical behavior with very specific and precise spacing due to the exact cancellation produced by the 180-degree phase shift between adjacent spatial light modulator pixels, without topological limitations. Additionally, the disclosed spatial light modulators and methods of use thereof provide improved pixel blending.

While the foregoing is directed to embodiments of the present disclosure, other and further embodiments of the disclosure may be devised without departing from the basic scope thereof, and the scope thereof is determined by the claims that follow.

What is claimed is:

1. A spatial light modulator, comprising:
    an array of spatial light modulator pixels having at least:
        a first pair of adjacent spatial light modulator pixels including a first spatial light modulator pixel and a second spatial light modulator pixel adjacent to one another; and
        a second pair of adjacent spatial light modulator pixels including a third spatial light modulator pixel and a fourth spatial light modulator pixel adjacent to one another,
        wherein:
            either the first or the second spatial light modulator pixel of the first pair of adjacent spatial light modulator pixels is tilted to achieve a phase shift of 180 degrees between the adjacent first spatial light modulator pixel and the second spatial light modulator pixel, and
            either the third or the fourth spatial light modulator pixel of the second pair of adjacent spatial light modulator pixels is tilted to achieve a phase shift of 180 degrees between the adjacent third spatial light modulator pixel and the fourth spatial light modulator pixel, and wherein the first pair of adjacent spatial light modulator pixels and the second pair of adjacent spatial light modulator pixels form a first image and a second image that partially overlap on a substrate.

2. The spatial light modulator of claim 1, wherein the array of spatial light modulator pixels is an array of micromirrors, and wherein at least one of the first spatial light modulator pixel and the second spatial light modulator pixel is positioned at a height selected to achieve the phase shift of 180 degrees.

3. The spatial light modulator of claim 1, wherein the array of spatial light modulator pixels is an array of micromirrors, and wherein the spatial light modulator further comprises a plurality of hinges, at least one of the plurality of hinges being associated with at least one of the array of micromirrors.

4. The spatial light modulator of claim 3, wherein at least one of the first spatial light modulator pixel and the second spatial light modulator pixel is tilted about at least one of the plurality of hinges at a tilt angle selected to achieve the phase shift of 180 degrees.

5. The spatial light modulator of claim 4, wherein electrostatically controlling the tilt angle by varying an applied voltage achieves the tilt angle selected and the phase shift of 180 degrees.

6. The spatial light modulator of claim 4, wherein utilizing a fluid with a predetermined index of refraction achieves the tilt angle selected and the phase shift of 180 degrees.

7. The spatial light modulator of claim 6, wherein the fluid is a gas.

8. The spatial light modulator of claim 3, wherein each of a first portion of the plurality of hinges is oriented a diagonal orientation, and wherein each of a second portion of the plurality of hinges is oriented parallel to an edge of each of the micromirrors.

9. The spatial light modulator of claim 1, wherein each pixel in the array of spatial light modulator pixels is bright, dark, or attenuated.

10. The spatial light modulator of claim 1, wherein the array of spatial light modulator pixels are switchable to generate a pattern of spatial light modulator pixels.

11. The spatial light modulator of claim 10, wherein the pattern of spatial light modulator pixels modulates an optical beam to provide a selected level of attenuation.

12. The spatial light modulator of claim 1, further comprises an array of liquid crystals.

13. The spatial light modulator of claim 1, further comprises an array of microscopic light emitting devices (microLEDs).

* * * * *